(12) United States Patent
Xu

(10) Patent No.: US 11,245,170 B2
(45) Date of Patent: *Feb. 8, 2022

(54) MULTILAYER BOARD AND ELECTRONIC DEVICE

(71) Applicant: Murata Manufacturing Co., Ltd., Nagaokakyo (JP)

(72) Inventor: Chu Xu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/096,091

(22) Filed: Nov. 12, 2020

(65) Prior Publication Data

US 2021/0066775 A1    Mar. 4, 2021

Related U.S. Application Data

(63) Continuation of application No. 16/439,733, filed on Jun. 13, 2019, now Pat. No. 10,873,120, which is a (Continued)

(30) Foreign Application Priority Data

Jan. 27, 2017 (JP) .............................. JP2017-013280

(51) Int. Cl.
*H01P 3/08* (2006.01)
*H05K 1/02* (2006.01)
(Continued)

(52) U.S. Cl.
CPC ................ *H01P 3/08* (2013.01); *H01L 23/12* (2013.01); *H01P 3/085* (2013.01); *H05K 1/02* (2013.01); *H05K 1/0298* (2013.01); *H05K 3/46* (2013.01)

(58) Field of Classification Search
CPC . H01P 3/08; H01P 3/085; H01P 3/088; H05K 1/02; H05K 1/0298
(Continued)

(56) References Cited

U.S. PATENT DOCUMENTS 9,130,251 B2 * 9/2015 Kato ....................... H01P 3/085
10,873,120 B2 * 12/2020 Xu ........................... H01P 3/085

FOREIGN PATENT DOCUMENTS

JP         11163539 A  *  6/1999  ............... H05K 1/02
JP         2004-247616 A     9/2004
JP         2006-351647 A    12/2006

OTHER PUBLICATIONS

Xu, "Multilayer Board and Electronic Device", U.S. Appl. No. 16/439,733, filed Jun. 13, 2019.
(Continued)

*Primary Examiner* — Stephen E. Jones
(74) *Attorney, Agent, or Firm* — Keating & Bennett, LLP

(57) ABSTRACT

A multilayer board includes a layered body including insulating base material layers that are laminated, and first and second signal lines, a first ground conductor including a first opening, a second ground conductor, a third ground conductor, and an interlayer connecting conductor. The first signal line overlaps the first opening when seen in a layering direction. The second signal line is provided on a layer different from a layer including the first signal line and includes a portion extending side by side with the first signal line when seen in the Z-axis direction. The first, second, and third ground conductors are connected by the interlayer connecting conductor. The third ground conductor is disposed on a layer including the first signal line or a layer positioned between the first signal line and the second signal line.

15 Claims, 11 Drawing Sheets

Related U.S. Application Data continuation of application No. PCT/JP2018/001701, filed on Jan. 22, 2018.

(51) Int. Cl.
*H01L 23/12* (2006.01)
*H05K 3/46* (2006.01)

(58) Field of Classification Search
USPC .................................................. 333/238, 246
See application file for complete search history.

(56) References Cited

OTHER PUBLICATIONS

Official Communication issued in corresponding Japanese Patent Application No. 2020-101339, dated Aug. 31, 2021.

* cited by examiner

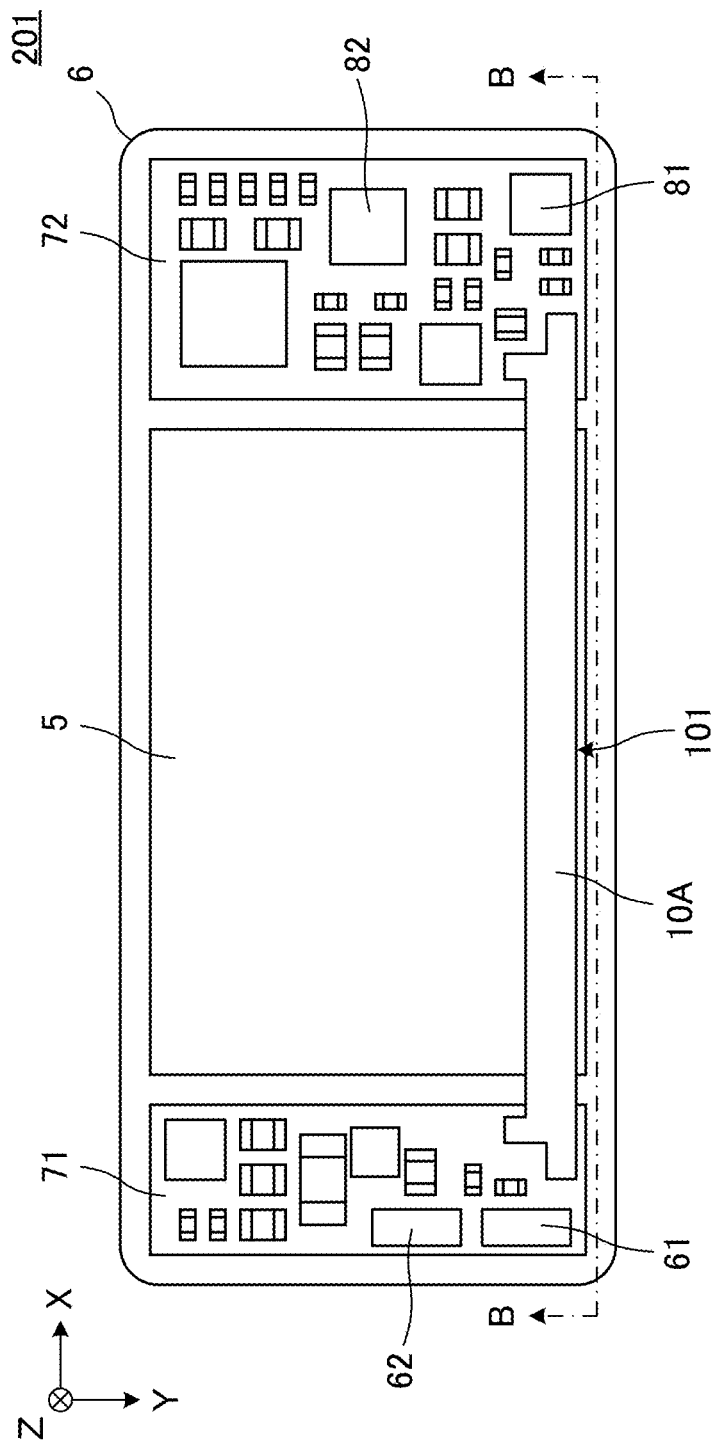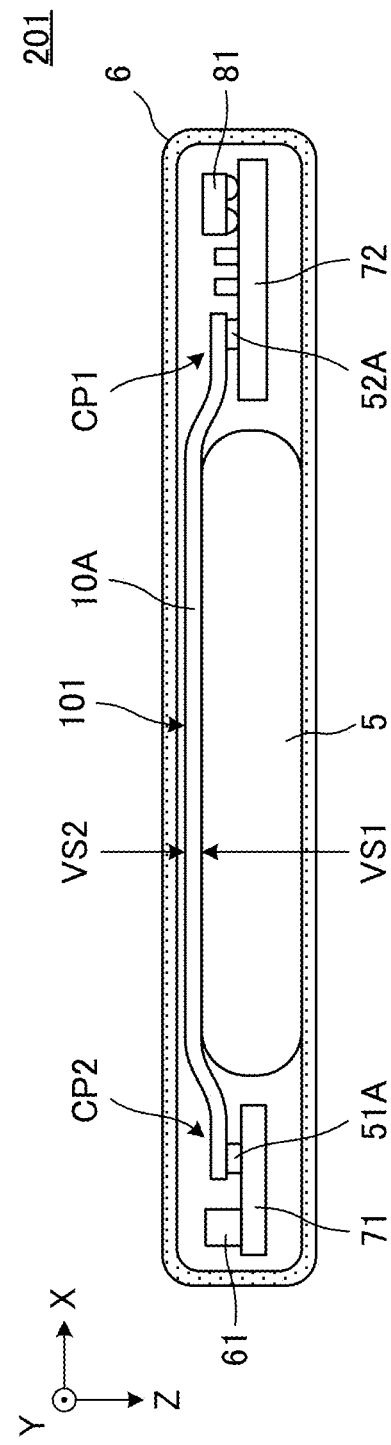

Fig.11
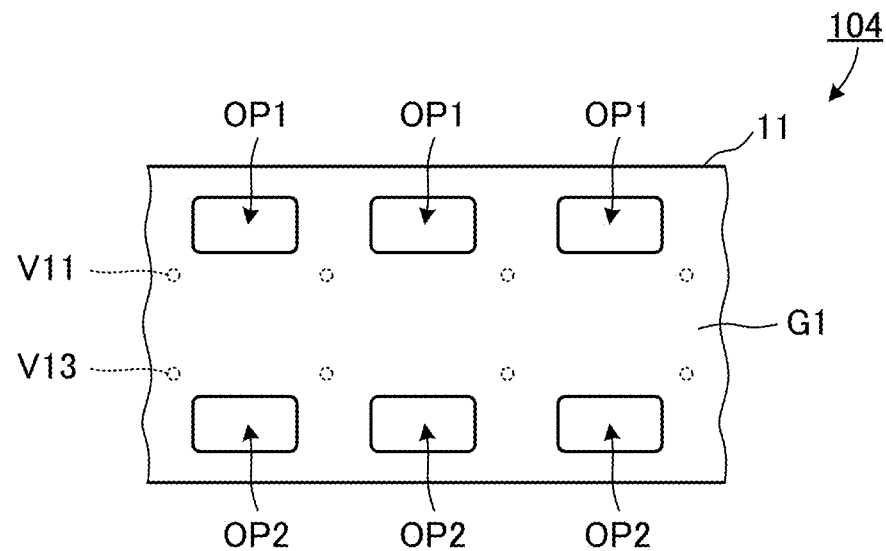
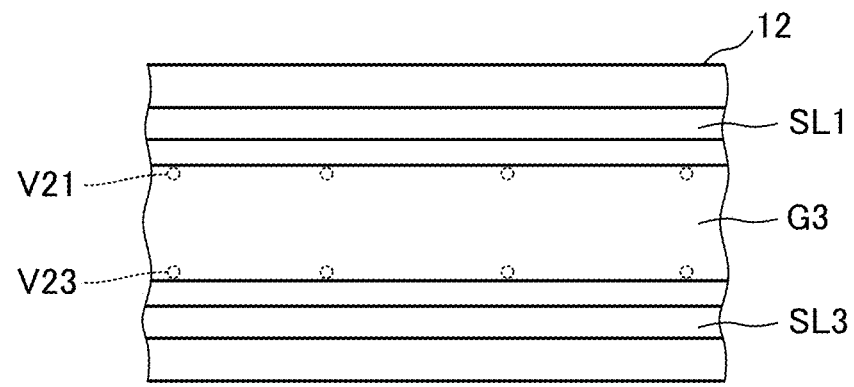
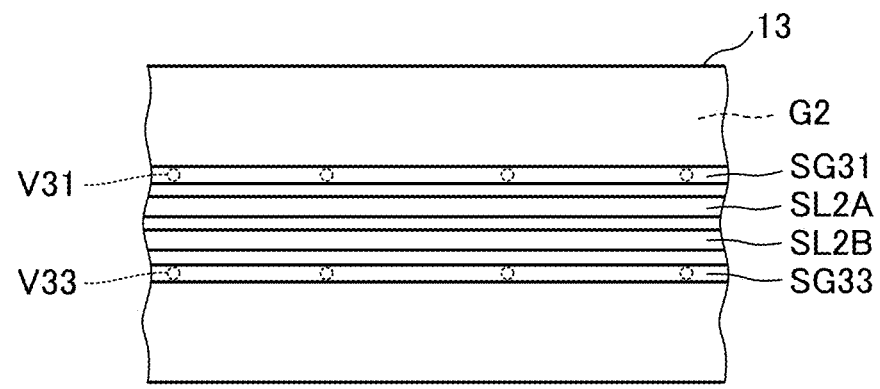
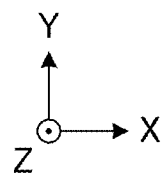

MULTILAYER BOARD AND ELECTRONIC DEVICE

CROSS REFERENCE TO RELATED APPLICATIONS

This application claims the benefit of priority to Japanese Patent Application No. 2017-13280 filed on Jan. 27, 2017 and is a Continuation Application of PCT Application No. PCT/JP2018/001701 filed on Jan. 22, 2018. The entire contents of each of these applications are hereby incorporated herein by reference.

BACKGROUND OF THE INVENTION

1. Field of the Invention

The present invention relates to a multilayer board, and particularly, to a multilayer board including a plurality of transmission lines. The present invention also relates to an electronic device, and particularly, to an electronic device including the multilayer board.

2. Description of the Related Art

Conventionally, there is a known multilayer board which is a layered body formed by layering a plurality of insulating base material layers and provided with a plurality of transmission lines.

For example, PCT International Publication No. 2014/178295 shows a multilayer board including a first signal line, a second signal line, a first ground conductor including openings, a second ground conductor, and a sub-ground conductor. In the multilayer board, the openings overlap the signal line (the first signal line or the second signal line) and, as a result, the adjacent signal lines are disposed at different positions in a layering direction of a plurality of insulating base material layers. Therefore, it is possible to increase a distance between the adjacent signal lines and isolation between the adjacent signal lines is secured.

In the multilayer board, the sub-ground conductor is disposed between the first signal line and the second signal line, which further enhances the isolation between the adjacent signal lines.

However, disposing the sub-ground conductor between the adjacent signal lines as in the multilayer board shown in PCT International Publication No. 2014/178295 is not necessarily enough to satisfactorily secure the isolation between the plurality of signal lines in some cases.

SUMMARY OF THE INVENTION

Preferred embodiments of the present invention provide multilayer boards that each achieve greatly improved isolation between a plurality of signal lines in a configuration in which the adjacent signal lines are disposed at different positions in a layering direction of a plurality of insulating base material layers.

A multilayer board according to a preferred embodiment of the present invention includes a layered body including a plurality of insulating base material layers that are layered, and a first signal line, a second signal line, a first ground conductor including a first opening, a second ground conductor, a third ground conductor, an interlayer connecting conductor, and a first sub-ground conductor provided in and on the plurality of insulating base material layers, wherein a first transmission line includes the first signal line, the first ground conductor, the second ground conductor, the insulating base material layer sandwiched between the first signal line and the first ground conductor of the plurality of insulating base material layers, and the insulating base material layer sandwiched between the first signal line and the second ground conductor of the plurality of insulating base material layers, a second transmission line includes the second signal line, the second ground conductor, the third ground conductor, the insulating base material layer sandwiched between the second signal line and the second ground conductor of the plurality of insulating base material layers, and the insulating base material layer sandwiched between the second signal line and the third ground conductor of the plurality of insulating base material layers, the first signal line overlaps the first opening when seen in a layering direction of the plurality of insulating base material layers, no signal line exists between the second signal line and the first signal line, the second signal line is provided on a layer different from a layer including the first signal line, the second signal line includes a portion extending side by side with the first signal line when seen in the layering direction, the first ground conductor, the second ground conductor, and the third ground conductor are connected by the interlayer connecting conductor, the third ground conductor is disposed on a layer including the first signal line or a layer disposed between the first signal line and the second signal line, the first sub-ground conductor is disposed between the first signal line and the second signal line when seen in the layering direction and disposed between the second ground conductor and the third ground conductor in the layering direction, and the second ground conductor and the third ground conductor are connected by the first sub-ground conductor and the interlayer connecting conductor.

If the first signal line overlaps the first opening in the first ground conductor, a capacitance between the first signal line and the first ground conductor is reduced and, therefore, it is possible to dispose the first signal line close to the first ground conductor. Therefore, it is possible to dispose the first signal line and the second signal line at different positions in the layering direction of the plurality of insulating base material layers. As a result, with this configuration, as compared with the case in which the first signal line and the second signal line are disposed on the same layer, it is possible to increase a distance between the first signal line and the second signal lines to secure isolation between the first signal line and the second signal line.

In this configuration, because the third ground conductor is disposed on a layer including the first signal line or a layer disposed between the first signal line and the second signal line, a distance between the second signal line and the third ground conductor is shorter than the distance between the first signal line and the second signal line. Therefore, a magnetic field generated around the second signal line is effectively intercepted, which further improves the isolation between the first signal line and the second signal line.

A multilayer board according to a preferred embodiment of the present invention further includes a first sub-ground conductor provided on the plurality of insulating base material layers and the first sub-ground conductor is disposed between the first signal line and the second signal line when seen in the layering direction and disposed between the second ground conductor and the third ground conductor in the layering direction. With this configuration, it is possible to further improve the isolation between the first signal line and the second signal line to further increase a crosstalk reduction or prevention effect.

In a multilayer board according to a preferred embodiment of the present invention, preferably, the multilayer board includes a second sub-ground conductor provided on the plurality of insulating base material layers and the second sub-ground conductor is disposed at a position on an opposite side of the first signal line from the second signal line when seen in the layering direction and disposed between the first ground conductor and the third ground conductor in the layering direction. With this configuration, as compared with the case in which the second sub-ground conductor is not provided, it is possible to reduce or prevent unnecessary radiation from the first signal line.

In a multilayer board according to a preferred embodiment of the present invention, preferably, the multilayer board includes a third sub-ground conductor provided on the plurality of insulating base material layers and the third sub-ground conductor is disposed at a position on an opposite side of the second signal line from the first signal line when seen in the layering direction and disposed between the second ground conductor and the third ground conductor in the layering direction. With this configuration, as compared with the case in which the third sub-ground conductor is not provided, it is possible to reduce or prevent unnecessary radiation from the second signal line.

In a multilayer board according to a preferred embodiment of the present invention, preferably, the interlayer connecting conductor includes a first interlayer connecting conductor disposed between the first signal line and the second signal line when seen in the layering direction. With this configuration, it is possible to further improve the isolation between the first signal line and the second signal line to further increase a crosstalk reduction or prevention effect.

In a multilayer board according to a preferred embodiment of the present invention, preferably, the interlayer connecting conductor includes a second interlayer connecting conductor disposed at a position on the opposite side of the first signal line from the second signal line when seen in the layering direction. With this configuration, as compared with the case in which the second interlayer connecting conductor is not provided, it is possible to further reliably reduce or prevent the unnecessary radiation from the first signal line.

In a multilayer board according to a preferred embodiment of the present invention, preferably, the interlayer connecting conductor includes a third interlayer connecting conductor disposed at a position on the opposite side of the second signal line from the first signal line when seen in the layering direction. With this configuration, as compared with the case in which the third interlayer connecting conductor is not provided, it is possible to further reliably reduce or prevent the unnecessary radiation from the second signal line.

In a multilayer board according to a preferred embodiment of the present invention, the first transmission line may be a line to transmit an analog signal and the second transmission line may be a line to transmit a digital signal.

In a multilayer board according to a preferred embodiment of the present invention, the first opening includes a plurality of first openings that may be arranged along an extending direction of the first signal line when seen in the layering direction.

In a multilayer board according to a preferred embodiment of the present invention, preferably, the multilayer board further includes a third signal line provided on one of the plurality of insulating base material layers, and a second opening provided in the first ground conductor, wherein the third signal line overlaps the second opening when seen in the layering direction and is disposed at a position on the opposite side of the second signal line from the first signal line, a third transmission line includes the third signal line, the first ground conductor, the second ground conductor, the insulating base material layer sandwiched between the third signal line and the first ground conductor of the plurality of insulating base material layers, and the insulating base material layer sandwiched between the third signal line and the second ground conductor of the plurality of insulating base material layers, the second signal line is provided on a layer different from a layer including the third signal line and includes a portion extending side by side with the third signal line when seen in the layering direction, and the third ground conductor is disposed on a layer including the third signal line or a layer disposed between the third signal line and the second signal line.

With this configuration, because the third signal line and the second signal line are disposed at the different positions in the layering direction of the plurality of insulating base material layers, as compared with the case in which the third signal line and the second signal line are disposed on the same layer, it is possible to increase a distance between the third signal line and the second signal line. As a result, it is possible to improve isolation between the third signal line and the second signal line.

In this configuration, because the third ground conductor is disposed on a layer including the third signal line or a layer disposed between the third signal line and the second signal line, a distance between the second signal line and the third ground conductor is shorter than the distance between the third signal line and the second signal line. Therefore, the magnetic field generated around the second signal line is effectively intercepted, which further improves the isolation between the third signal line and the second signal line.

In a multilayer board according to a preferred embodiment of the present invention, the second opening includes a plurality of second openings that may be arranged along an extending direction of the third signal line when seen in the layering direction.

An electronic device according to a preferred embodiment of the present invention includes a first circuit; a second circuit; and a multilayer board, wherein the first circuit and the second circuit are connected by the multilayer board, the multilayer board includes a layered body including a plurality of insulating base material layers that are layered, and a first signal line, a second signal line, a first ground conductor including a first opening, a second ground conductor, a third ground conductor, an interlayer connecting conductor, and a first sub-ground conductor provided in and on any of the plurality of insulating base material layers, a first transmission line includes the first signal line, the first ground conductor, the second ground conductor, the insulating base material layer sandwiched between the first signal line and the first ground conductor of the plurality of insulating base material layers, and the insulating base material layer sandwiched between the first signal line and the second ground conductor of the plurality of insulating base material layers, a second transmission line includes the second signal line, the second ground conductor, the third ground conductor, the insulating base material layer sandwiched between the second signal line and the second ground conductor of the plurality of insulating base material layers, and the insulating base material layer sandwiched between the second signal line and the third ground conductor of the plurality of insulating base material layers, the first signal line overlaps the first opening when seen in a layering direction of the plurality of insulating base material layers, no signal line exists between the second signal line and the first signal line, the second signal line is provided on a layer different from a layer including the first signal line, the second signal line includes a portion extending side by side with the first signal line when seen in the layering direction, the interlayer connecting conductor connects the first ground conductor, the second ground conductor, and the third ground conductor to one another, the third ground conductor is disposed on a layer including the first signal line or a layer disposed between the first signal line and the second signal line, the first sub-ground conductor is disposed between the first signal line and the second signal line when seen in the layering direction and disposed between the second ground conductor and the third ground conductor in the layering direction, and the second ground conductor and the third ground conductor are connected by the first sub-ground conductor and the interlayer connecting conductor.

With this configuration, it is possible to achieve an electronic device including the multilayer board with the improved isolation between the plurality of signal lines.

According to preferred embodiments of the present invention, it is possible to achieve multilayer boards each having further improved isolation between the adjacent signal lines in the configuration in which the adjacent signal lines are disposed at the different positions in the layering direction of the plurality of insulating base material layers.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a plan perspective view of an electronic device 201 according to the first preferred embodiment of the present invention and FIG. 4B is a sectional view taken along line B-B in FIG. 4A.

FIG. 11 is an exploded plan view of the line portion of the multilayer board 104.

DETAILED DESCRIPTION OF THE PREFERRED EMBODIMENTS

Figure 1:
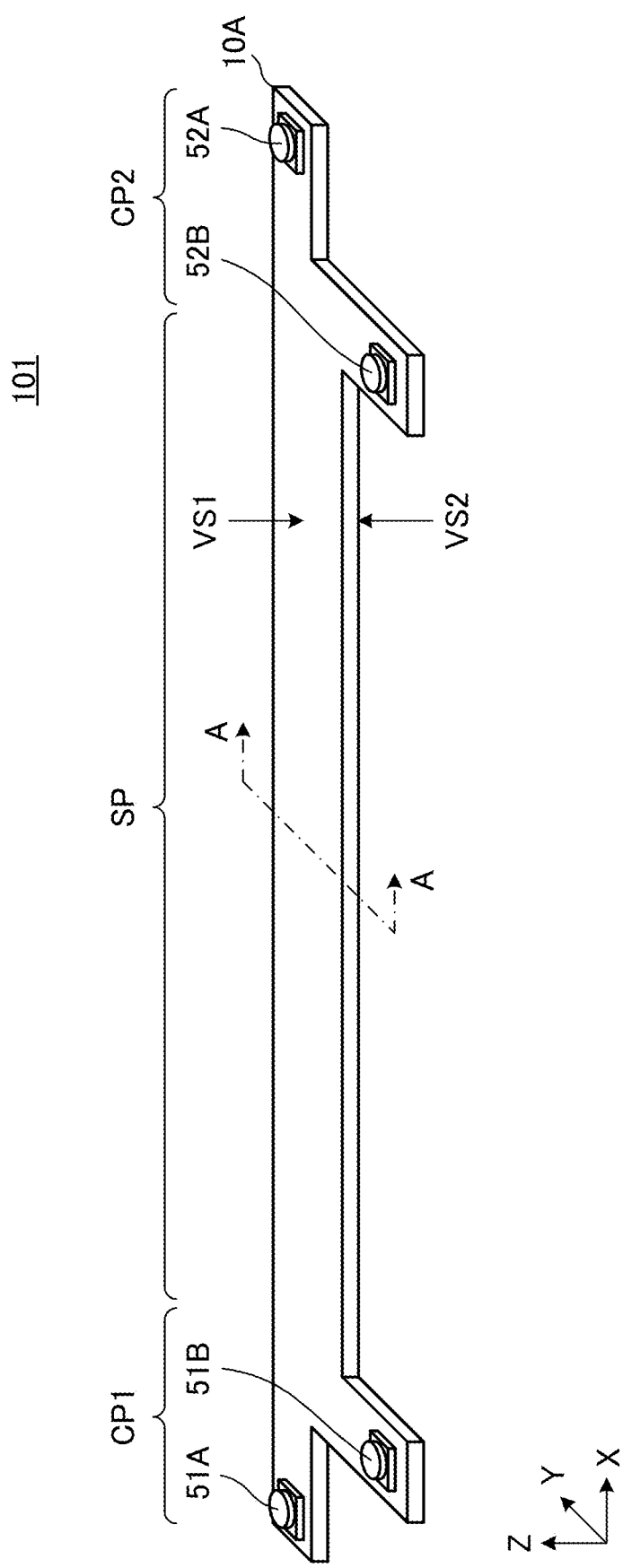
FIG. 1 is a perspective view of a multilayer board 101 according to a first preferred embodiment of the present invention.

Preferred embodiments of the present invention will be described below with reference to a few concrete examples and the drawings. In the drawings, the same or similar portions are provided with the same reference signs. In order to describe key points or to facilitate understanding, the preferred embodiments are described separately for convenience. However, configurations shown in the different preferred embodiments may be partially interchanged or combined with each other. In the second preferred embodiment and the subsequent preferred embodiments, the same or similar points as those of the first preferred embodiment will not be described and only different points will be described. Especially, similar advantageous functions and effects obtained by similar configurations will not be described repeatedly in every preferred embodiment.

First Preferred Embodiment

Figure 2:
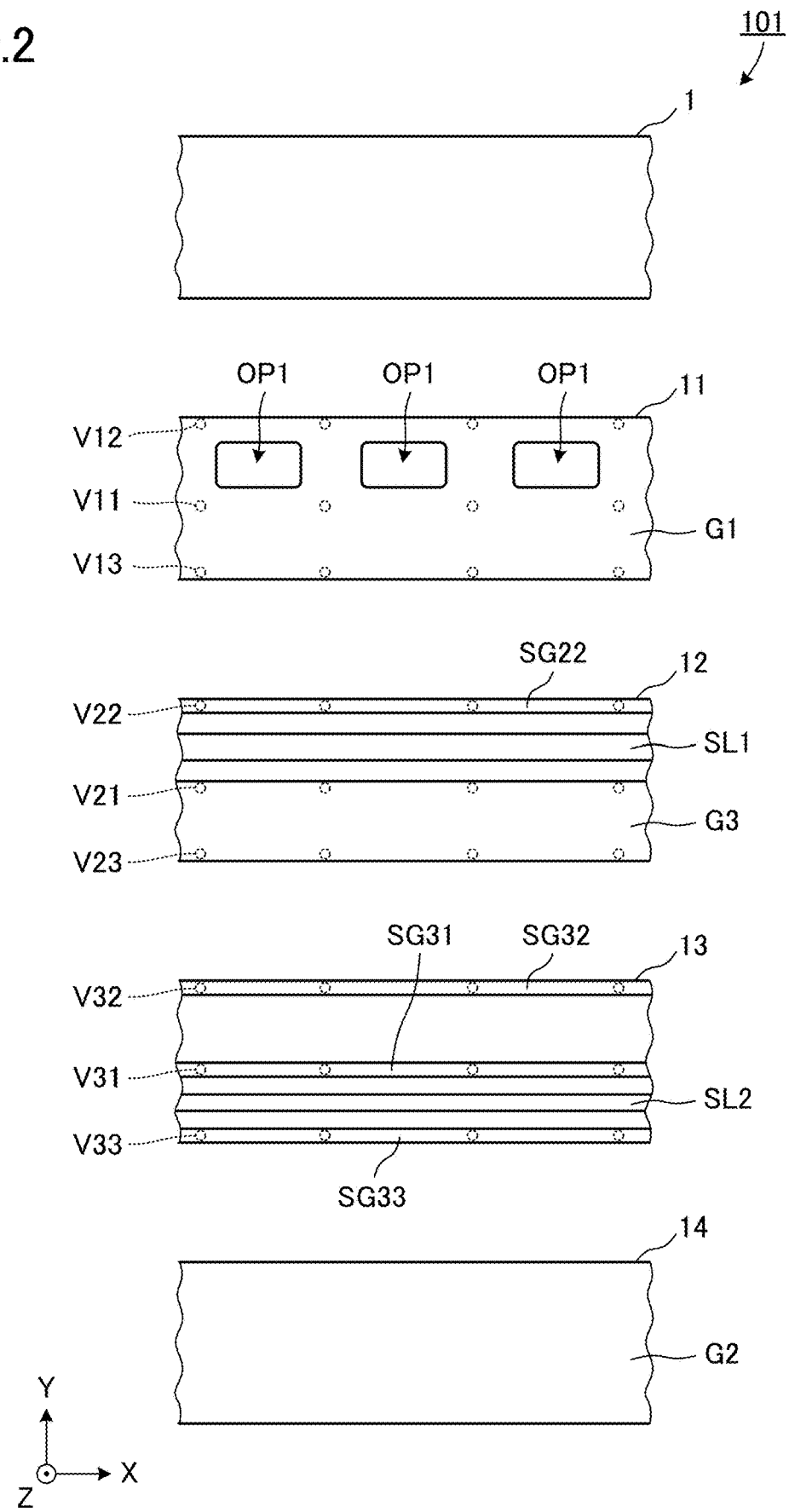
FIG. 2 is an exploded plan view of a line portion SP of the multilayer board 101.
Figure 3:
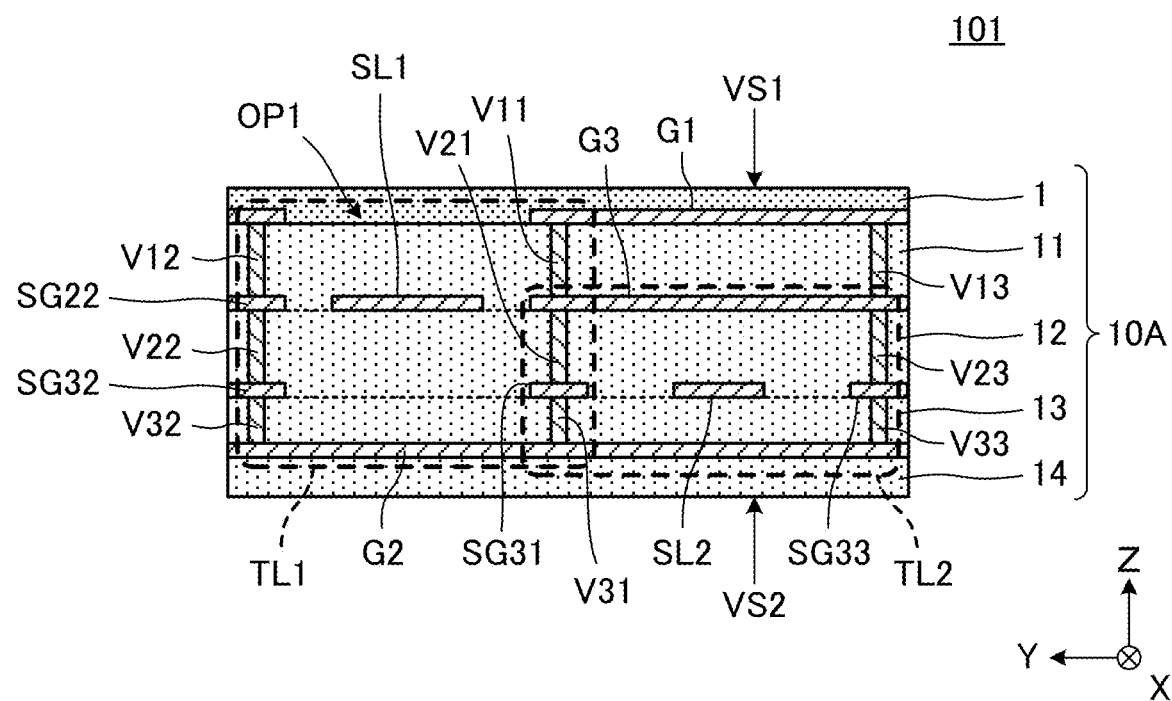
FIG. 3 is a sectional view of the multilayer board 101 taken along line A-A in FIG. 1.

FIG. 1 is a perspective view of a multilayer board 101 according to a first preferred embodiment of the present invention. FIG. 2 is an exploded plan view of a line portion SP of the multilayer board 101. FIG. 3 is a sectional view of the multilayer board 101 taken along line A-A in FIG. 1.

The multilayer board 101 includes a layered body 10A including a plurality of insulating base material layers 11, 12, 13, 14 and a protective layer 1 that are layered, conductors provided in and on the insulating base material layers 11, 12, 13, (a first signal line SL1, a second signal line SL2, a first ground conductor G1, a second ground conductor G2, a third ground conductor G3, a first sub-ground conductor SG31, second sub-ground conductors SG22, SG32, a third sub-ground conductor SG33, and a plurality of interlayer connecting conductors V11, V12, V13, V21, V22, V23, V31, V32, V33), and connectors 51A, 51B, 52A, 52B.

As shown in FIG. 1, the multilayer board 101 includes the line portion SP, a first connection portion CP1, and a second connection portion CP2. The first connection portion CP1, the line portion SP, and the second connection portion CP2 are arranged in this order in a +X direction. The first connection portion CP1 is a portion branching out in a Y shape from the line portion SP. The second connection portion CP2 branches out in a Y shape from the line portion SP.

The layered body 10A is preferably, for example, a rectangular or substantially rectangular flat plate which is long in an X-axis direction and has flexibility. The layered body 10A includes a first main surface VS1 and a second main surface VS2 facing each other. As shown in FIGS. 2 and 3, the layered body 10A is provided by layering the insulating base material layers 14, 13, 12, 11 and the protective layer 1 in this order.

The plurality of insulating base material layers 11, 12, 13, 14 are flat plates which are long in the X-axis direction. For example, the insulating base material layers 11, 12, 13, 14 are preferably thermoplastic resin flat plates and are sheets mainly made of liquid crystal polymer and having flexibility.

On a surface of the insulating base material layer 11, the first ground conductor G1 including a plurality of first openings OP1 is provided. The first ground conductor G1 is provided on the entire or substantially the entire surface of the insulating base material layer 11. The plurality of first openings OP1 are preferably, for example, rectangular or substantially rectangular openings which are disposed at positions closer to a first side of the insulating base material layer 11 (an upper side of the insulating base material layer 11 in FIG. 2) and which are arranged in the X-axis direction. The first ground conductor G1 is preferably a conductor pattern made of Cu foil or other suitable material, for example.

In the insulating base material layer 11, the plurality of interlayer connecting conductors V11, V12, V13 are provided. The plurality of interlayer connecting conductors V11 are disposed at central positions in a short-side direction (Y-axis direction) of the insulating base material layer 11 and arranged in the X-axis direction. The plurality of interlayer connecting conductors V12 are disposed at positions close to the first side of the insulating base material layer 11 (the upper side of the insulating base material layer 11 in FIG. 2) and arranged in the X-axis direction. The plurality of interlayer connecting conductors V13 are disposed at positions close to a second side of the insulating base material layer 11 (a lower side of the insulating base material layer 11 in FIG. 2) and arranged in the X-axis direction. The interlayer connecting conductors V11, V12, V13 are preferably via conductors, through holes, or other suitable conductors, for example.

On a surface of the insulating base material layer 12, the first signal line SL1, the second sub-ground conductor SG22, and the third ground conductor G3 are provided. The first signal line SL1 is a linear conductor which is disposed at a position displaced to a first side of the insulating base material layer 12 (an upper side of the insulating base material layer 12 in FIG. 2) from a center in a short-side direction (Y-axis direction) of the insulating base material layer 12 and which extends in the X-axis direction. The second sub-ground conductor SG22 is a linear conductor disposed close to the first side of the insulating base material layer 12 and extending in the X-axis direction. The third ground conductor G3 is a linear conductor disposed close to a second side of the insulating base material layer 12 (a lower side of the insulating base material layer 12) and extending in the X-axis direction. As shown in FIG. 2, the second sub-ground conductor SG22, the first signal line SL1, and the third ground conductor G3 are arranged in this order along the short-side direction (Y-axis direction) of the insulating base material layer 12. The first signal line SL1, the second sub-ground conductor SG22, and the third ground conductor G3 are preferably conductor patterns made of Cu foil or other suitable material, for example.

In the insulating base material layer 12, the plurality of interlayer connecting conductors V21, V22, V23 are provided. The plurality of interlayer connecting conductors V21 are disposed at central positions in the short-side direction (Y-axis direction) of the insulating base material layer 12 and arranged in the X-axis direction. The plurality of interlayer connecting conductors V22 are disposed at positions close to the first side of the insulating base material layer 12 (the upper side of the insulating base material layer 12) and arranged in the X-axis direction. The plurality of interlayer connecting conductors V23 are disposed at positions close to the second side of the insulating base material layer 12 (the lower side of the insulating base material layer 12) and arranged in the X-axis direction. The interlayer connecting conductors V21, V22, V23 are preferably via conductors, through holes, or other suitable conductors, for example.

On a surface of the insulating base material layer 13, the second signal line SL2, the first sub-ground conductor SG31, the second sub-ground conductor SG32, and the third sub-ground conductor SG33 are provided. The second signal line SL2 is a linear conductor which is disposed at a position displaced to a second side of the insulating base material layer 13 (a lower side of the insulating base material layer 13 in FIG. 2) from a center in a short-side direction (Y-axis direction) of the insulating base material layer 13 and which extends in the X-axis direction. The first sub-ground conductor SG31 is a linear conductor disposed at the center or approximate center of the insulating base material layer 13 and extending in the X-axis direction. The second sub-ground conductor SG32 is a linear conductor disposed close to a first side of the insulating base material layer 13 (an upper side of the insulating base material layer 13) and extending in the X-axis direction. The third sub-ground conductor SG33 is a linear conductor disposed close to the second side of the insulating base material layer 13 and extending in the X-axis direction. As shown in FIG. 2, the second sub-ground conductor SG32, the first sub-ground conductor SG31, the second signal line SL2, and the third sub-ground conductor SG33 are arranged in this order along the short-side direction (Y-axis direction) of the insulating base material layer 13. The second signal line SL2, the first sub-ground conductor SG31, the second sub-ground conductor SG32, and the third sub-ground conductor SG33 are conductor patterns preferably made of Cu foil or other suitable material, for example.

In the insulating base material layer 13, the plurality of interlayer connecting conductors V31, V32, V33 are provided. The plurality of interlayer connecting conductors V31 are disposed at central positions in the short-side direction (Y-axis direction) of the insulating base material layer 13 and arranged in the X-axis direction. The plurality of interlayer connecting conductors V32 are disposed at positions close to the first side of the insulating base material layer 13 and arranged in the X-axis direction. The plurality of interlayer connecting conductors V33 are disposed at positions close to the second side of the insulating base material layer 13 and arranged in the X-axis direction. The interlayer connecting conductors V31, V32, V33 are preferably via conductors, through holes, or other suitable conductors, for example.

On a surface of the insulating base material layer 14, the second ground conductor G2 is provided. The second ground conductor G2 is a provided on an entire or substantially an entire surface of the insulating base material layer 14. The second ground conductor G2 is a conductor pattern preferably made of Cu foil or other suitable material, for example.

The protective layer 1 has the same or substantially the same planar shape as the insulating base material layer 11 and is laid on an upper surface of the insulating base material layer 11. The protective layer 1 is preferably a solder resist film, for example.

In the present preferred embodiment, as shown in FIG. 3, a first transmission line TL1 includes the first signal line SL1, the first ground conductor G1, the second ground conductor G2, the insulating base material layer 11 sandwiched between the first signal line SL1 and the first ground conductor G1, and the insulating base material layers 12, 13 sandwiched between the first signal line SL1 and the second ground conductor G2. In "the first transmission line", only the insulating base material layer 11 is disposed and no other conductor exists between the first signal line SL1 and the first ground conductor G1 facing each other in a Z-axis direction. In "the first transmission line", only the insulating base material layers 12, 13 are disposed and no other conductor exists between the first signal line SL1 and the second ground conductor G2 facing each other in the Z-axis direction.

In the present preferred embodiment, a second transmission line TL2 includes the second signal line SL2, the second ground conductor G2, the third ground conductor G3, the insulating base material layer 12 sandwiched between the second signal line SL2 and the third ground conductor G3, and the insulating base material layer 13 sandwiched between the second signal line SL2 and the second ground conductor G2. In "the second transmission line", only the insulating base material layer 12 is disposed and no other conductor exists between the second signal line SL2 and the third ground conductor G3 facing each other in the Z-axis direction. In "the second transmission line", only the insulating base material layer 13 is disposed and no other conductor exists between the second signal line SL2 and the second ground conductor G2 facing each other in the Z-axis direction.

As shown in FIGS. 2 and 3, the first signal line SL1 overlaps the first openings OP1 when seen in a layering direction (Z-axis direction) of the plurality of insulating base material layers 11, 12, 13, 14. The first signal line SL1 has a greater line width (width in the Y-axis direction) than the second signal line SL2. The second signal line SL2 is provided on a layer different from a layer including the first signal line SL1 and includes a portion extending side by side with the first signal line SL1 when seen in the Z-axis direction.

In the present preferred embodiment, as shown in FIG. 2, for example, the plurality of first openings OP1 are arranged along an extending direction (X-axis direction) of the first signal line SL1 when seen in the Z-axis direction. In the present preferred embodiment, the third ground conductor G3 is disposed on a layer including the first signal line SL1.

The first ground conductor G1, the second ground conductor G2, and the third ground conductor G3 are connected by the plurality of interlayer connecting conductors V11, V12, V13, V21, V22, V23, V31, V32, V33. More specifically, as shown in FIG. 3, the interlayer connecting conductors V11, V13 connect the first ground conductor G1 and the third ground conductor G3 and the interlayer connecting conductors V12 connect the first ground conductor G1 and the second sub-ground conductor SG22. The interlayer connecting conductors V21 connect the third ground conductor G3 and the first sub-ground conductor SG31, the interlayer connecting conductors V22 connect the second sub-ground conductor SG22 and the second sub-ground conductor SG32, and the interlayer connecting conductors V23 connect the third ground conductor G3 and the third sub-ground conductor SG33. The interlayer connecting conductors V31 connect the first sub-ground conductor SG31 and the second ground conductor G2, the interlayer connecting conductors V32 connect the second sub-ground conductor SG32 and the second ground conductor G2, and the interlayer connecting conductors V33 connect the third sub-ground conductor SG33 and the second ground conductor G2.

Between the first signal line SL1 and the second signal line SL2, the interlayer connecting conductors V11, V21, V31 are disposed at midpoint or substantial midpoint positions between the first signal line SL1 and the second signal line SL2 when seen in the Z-axis direction. In the present preferred embodiment, the interlayer connecting conductors V11, V21, V31 correspond to "first interlayer connecting conductors".

The interlayer connecting conductors V12, V22, V32 are disposed at positions on an opposite side of the first signal line SL1 from the second signal line SL2 (to be farther from the first signal line SL1 in a +Y direction in FIG. 3) when seen in the Z-axis direction. In the present preferred embodiment, the interlayer connecting conductors V12, V22, V32 correspond to "second interlayer connecting conductors".

The interlayer connecting conductors V13, V23, V33 are disposed at positions on an opposite side of the second signal line SL2 from the first signal line SL1 (to be farther from the second signal line SL2 in a −Y direction in FIG. 3) when seen in the Z-axis direction. In the present preferred embodiment, the interlayer connecting conductors V13, V23, V33 correspond to "third interlayer connecting conductors".

Furthermore, as shown in FIG. 3, the first sub-ground conductor SG31 is disposed between the first signal line SL1 and the second signal line SL2 when seen in the Z-axis direction and is disposed between the second ground conductor G2 and the third ground conductor G3 in the Z-axis direction.

The second sub-ground conductors SG22, SG32 are disposed at positions on the opposite side of the first signal line SL1 from the second signal line SL2 (to be farther from the first signal line SL1 in the +Y direction in FIG. 3) when seen in the Z-axis direction and disposed between the first ground conductor G1 and the second ground conductor G2 in the Z-axis direction.

The third sub-ground conductor SG33 is disposed at a position on the opposite side of the second signal line SL2 from the first signal line SL1 (to be farther from the second signal line SL2 in the −Y direction in FIG. 3) when seen in the Z-axis direction and disposed between the second ground conductor G2 and the third ground conductor G3 in the Z-axis direction.

As shown in FIGS. 2 and 3, the first sub-ground conductor SG31, the second sub-ground conductors SG22, SG32, and the third sub-ground conductor SG33 continuously extend side by side along the first signal line SL1 and the second signal line SL2.

The multilayer board 101 according to the present preferred embodiment obtains the following advantageous effects.

Because the first signal line SL1 overlaps the first openings OP1 in the first ground conductor G1 in the multilayer board 101, a capacitance between the first signal line SL1 and the first ground conductor G1 is reduced and it is possible to dispose the first signal line SL1 close to the first ground conductor G1. More specifically, the first signal line SL1 is sandwiched between the first ground conductor G1 and the second ground conductor G2 and displaced toward the first ground conductor G1 in the Z-axis direction. In other words, in the multilayer board 101, the first signal line SL1 and the second signal line SL2 are disposed at the different positions in the Z-axis direction. With this configuration, as compared with the case in which the first signal line SL1 and the second signal line SL2 are disposed on the same layer, it is possible to increase a distance between the first signal line SL1 and the second signal line SL2 to thereby secure isolation between the first signal line SL1 and the second signal line SL2.

Because the third ground conductor G3 is disposed on a layer including the first signal line SL1 in the multilayer board 101, a distance between the second signal line SL2 and the third ground conductor G3 is shorter than the distance between the first signal line SL1 and the second signal line SL2. Therefore, a magnetic field generated around the second signal line SL2 is effectively intercepted by the third ground conductor G3, which further improves the isolation between the first signal line SL1 and the second signal line SL2.

By disposing the third ground conductor G3 on a layer including the first signal line SL1, it is possible to reduce the number of insulating base material layers in and on which the conductors are provided. As a result, the number of steps for manufacturing the multilayer board 101 is reduced, which reduces the manufacturing cost.

The multilayer board 101 includes the first sub-ground conductor SG31 disposed between the first signal line SL1 and the second signal line SL2 when seen in the Z-axis direction and disposed between the second ground conductor G2 and the third ground conductor G3 in the Z-axis direction. Furthermore, the multilayer board 101 includes the first interlayer connecting conductors (interlayer connecting conductors V11, V21, V31) disposed between the first signal line SL1 and the second signal line SL2 when seen in the Z-axis direction. With this configuration, it is possible to further improve the isolation between the first signal line SL1 and the second signal line SL2 to further increase a crosstalk reduction or prevention effect.

The multilayer board 101 includes the second sub-ground conductors SG22, SG32 disposed on the opposite side of the first signal line SL1 from the second signal line SL2 when seen in the Z-axis direction and disposed between the first ground conductor G1 and the second ground conductor G2 in the Z-axis direction. The multilayer board 101 includes the second interlayer connecting conductors (interlayer connecting conductors V12, V22, V32) disposed at the positions on the opposite side of the first signal line SL1 from the second signal line SL2 (to be farther from the first signal line SL1 in the +Y direction) when seen in the Z-axis direction. With this configuration, as compared with the case in which the second sub-ground conductors SG22, SG32 or the second interlayer connecting conductors are not provided, it is possible to more reliably reduce or prevent the unnecessary radiation from the first signal line SL1. With this configuration, it is possible to further improve the isolation between the first signal line SL1 and the second signal line SL2.

The multilayer board 101 includes the third sub-ground conductor SG33 disposed on the opposite side of the second signal line SL2 from the first signal line SL1 when seen in the Z-axis direction and disposed between the second ground conductor G2 and the third ground conductor G3 in the Z-axis direction. The multilayer board 101 includes the third interlayer connecting conductors (interlayer connecting conductors V13, V23, V33) disposed at the positions on the opposite side of the second signal line SL2 from the first signal line SL1 (to be farther from the second signal line SL2 in the −Y direction) when seen in the Z-axis direction. With this configuration, as compared with the case in which the third sub-ground conductor SG33 or the third interlayer connecting conductors are not provided, it is possible to more reliably reduce or prevent the unnecessary radiation from the second signal line SL2. With this configuration, it is possible to further improve the isolation between the first signal line SL1 and the second signal line SL2.

The first signal line SL1 is displaced toward the first ground conductor G1 in the Z-axis direction and farther from the second ground conductor G2 than the second signal line SL2. The first signal line SL1 overlaps the first openings OP1 when seen in the Z-axis direction. In other words, the capacitance is less likely to be generated between the first signal line SL1 and the ground conductor. As a result, it is possible to make the line width (width in the Y-axis direction) of the first signal line SL1 greater than a line width of the second signal line SL2 to reduce a conductor loss of the first signal line SL1. If the line width of the first signal line SL1 is greater than the line width of the second signal line SL2, it is preferable to allocate a high-frequency signal susceptible to the conductor loss to the first transmission line TL1.

The multilayer board 101 according to the present preferred embodiment is manufactured in the following non-limiting example of steps.

(1) First, by laminating one main surfaces of insulating base material layers 11, 12, 13, 14 in a state of an assembled board with metal foil (e.g., Cu foil) and patterning the metal foil by using photolithography, the first signal line SL1, the second signal line SL2, the first ground conductor G1, the second ground conductor G2, the third ground conductor G3, the first sub-ground conductor SG31, the second sub-ground conductors SG22, SG32, the third sub-ground conductor SG33, and other conductors are formed. For the insulating base material layers 11, 12, 13, 14, thermoplastic resin base material, such as liquid crystal polymer, for example, is preferably used.

Moreover, the interlayer connecting conductors V11, V12, V13, V21, V22, V23, V31, V32, V33 are formed in the insulating base material layers 11, 12, 13, 14 in the state of the assembled board. The interlayer connecting conductors are formed by forming through holes using a laser or other suitable process, disposing conductive paste including one or more of copper, silver, tin, and other suitable materials, for example, and curing the conductive paste in a heating/pressurizing step afterwards.

(2) By layering the insulating base material layers 11, 12, 13, 14, curing the conductive paste and bonding the insulating base material layers 11, 12, 13, 14 by heating and pressurization, the layered body 10A in the state of the assembled board is formed. The protective layer 1 is formed on the side of the first main surface VS1 of the layered body 10A. The protective layer 1 is preferably a solder resist film, for example.

(3) The connectors (connectors 51A, 51B, 52A, 52B in FIG. 1) are mounted (bonded) to electrodes exposed on the first main surface VS1 of the layered body 10A. The mounting (bonding) of the connectors is preferably performed using conductive bonding material, such as solder, for example.

(4) Then, by dividing the layered body 10A in the state of the assembled board, the individual multilayer boards 101 are obtained. Steps (3) and (4) may be performed in reverse order.

Figure 5:
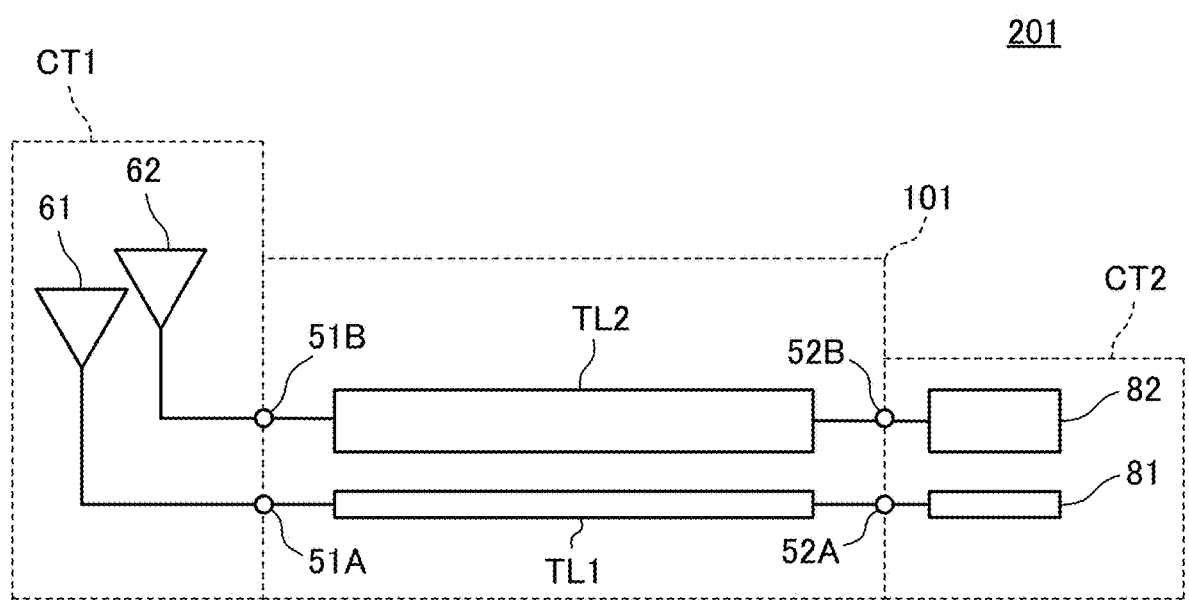
FIG. 5 is a circuit diagram of a portion of the electronic device 201 using the multilayer board 101.

Next, an electronic device including the multilayer board 101 will be described with reference to the drawings. FIG. 4A is a plan perspective view of an electronic device 201 according to the first preferred embodiment and FIG. 4B is a sectional view taken along line B-B in FIG. 4A. FIG. 5 is a circuit diagram of a portion of the electronic device 201 including the multilayer board 101.

The electronic device 201 includes a housing 6, the multilayer board 101 housed in the housing 6, a first circuit board 71, a second circuit board 72, a battery pack 5, and other components. The first circuit board 71, the battery pack 5, and the second circuit board 72 are arranged in this order along an X-axis direction. The first circuit board 71 and the second circuit board 72 are preferably printed wiring boards, for example.

On a main surface of the first circuit board 71, a first antenna 61, a second antenna 62, and other components are mounted. On a main surface of the second circuit board 72, a first feed circuit 81, a second feed circuit 82, and other components are mounted. The first feed circuit 81 is preferably a circuit for GPS reception, for example. The second feed circuit 82 is preferably a circuit for wireless LAN communication, for example. The first antenna 61 is preferably for the GPS, for example. The second antenna 62 is preferably for the wireless LAN communication, for example.

The first circuit board 71 and the second circuit board 72 are connected by the multilayer board 101. More specifically, the first connection portion CP1 of the multilayer board 101 is connected to the first circuit board 71 and the second connection portion CP2 is connected to the second circuit board 72. As shown in FIG. 4B, the connector 51A of the first connection portion CP1 is connected to a receptacle (not shown) disposed on the main surface of the first circuit board 71. The connector 52A of the second connection portion CP2 is connected to a receptacle (not shown) disposed on the main surface of the second circuit board 72.

As shown in FIG. 5, the first antenna 61 is connected to the first feed circuit 81 via the first transmission line TL1 of the multilayer board 101. The second antenna 62 is connected to the second feed circuit 82 via the second transmission line TL2 of the multilayer board 101.

In the present preferred embodiment, the circuits on the first circuit board 71 correspond to "a first circuit". The circuits on the second circuit board 72 correspond to "a second circuit".

With this configuration, it is possible to achieve the electronic device including the multilayer board 101 with the improved isolation between the plurality of signal lines.

Although the first circuit is the antenna for the GPS communication or the antenna for the wireless LAN communication in the example shown in the present preferred embodiment, "the first circuit" is not restricted to the antenna.

Second Preferred Embodiment

In an example of a multilayer board in a second preferred embodiment of the present invention, a third ground conductor is not disposed on a layer including a first signal line.

Figure 6:
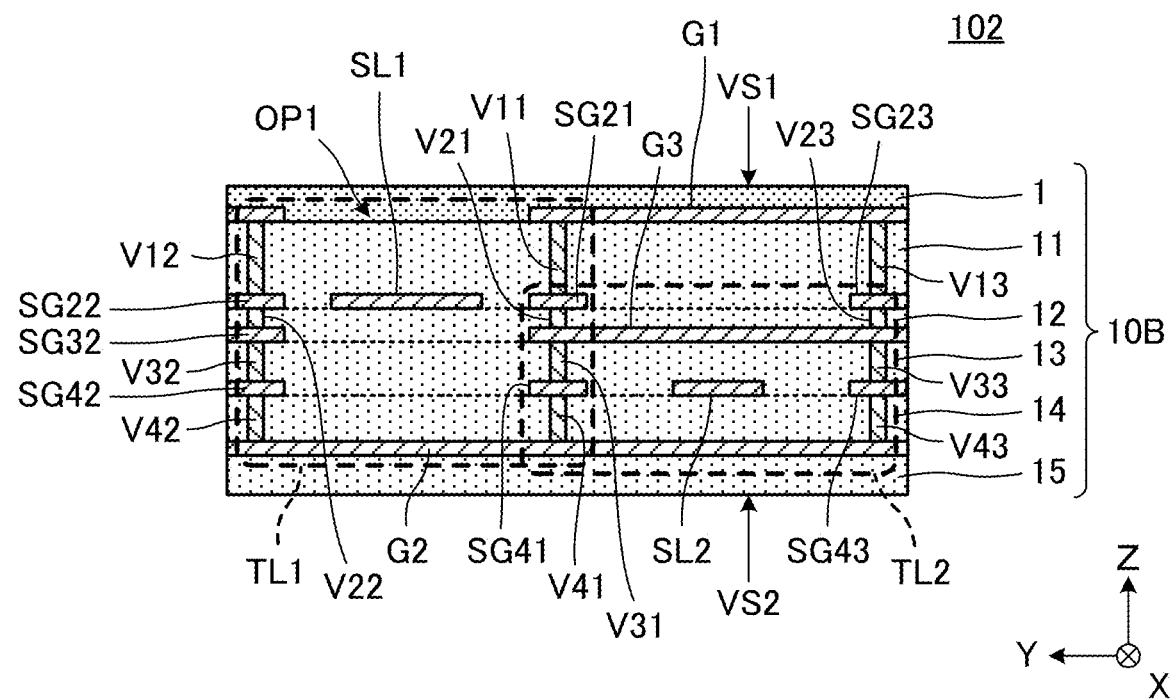
FIG. 6 is a sectional view of a line portion of a multilayer board 102 according to a second preferred embodiment of the present invention.
Figure 7:
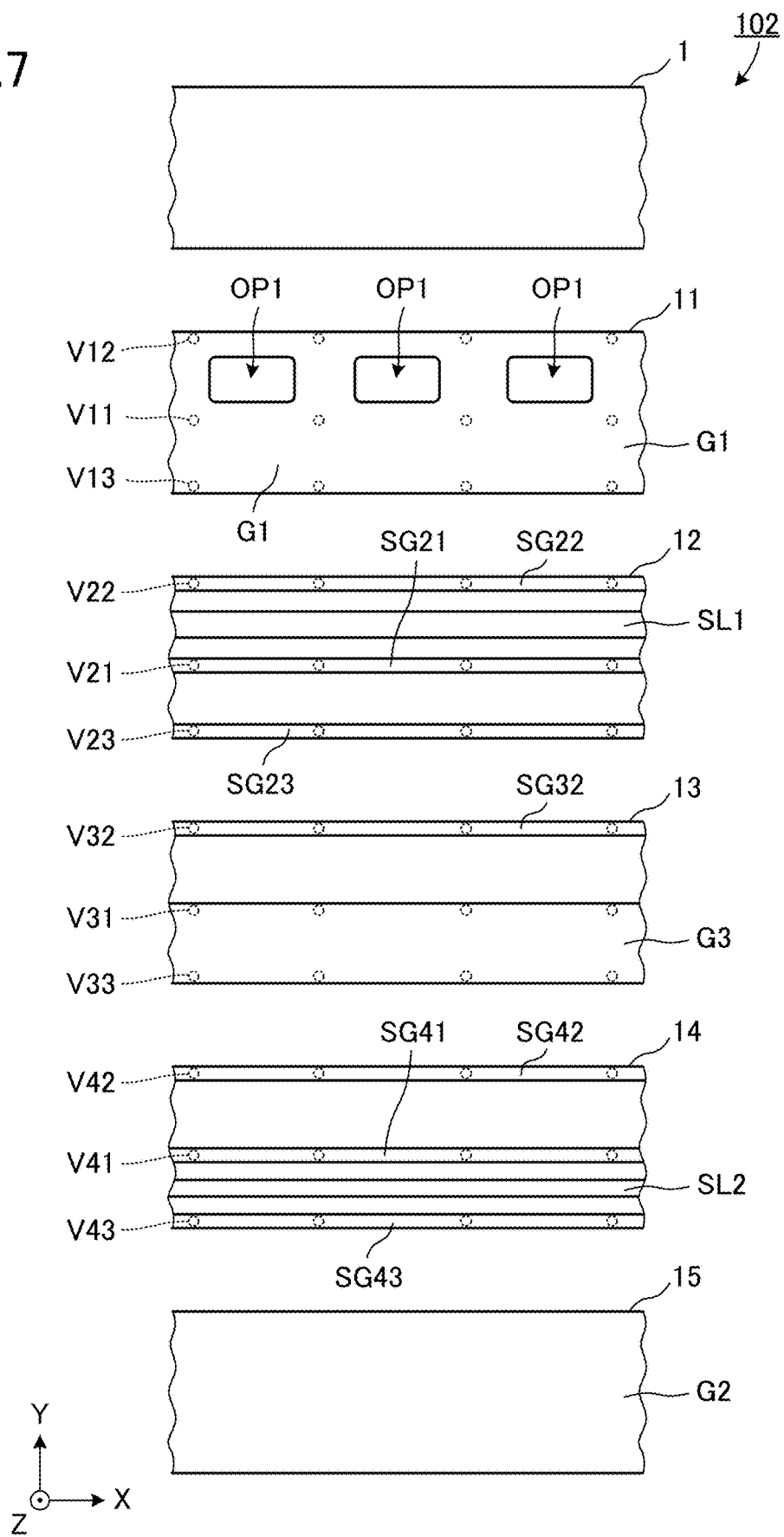
FIG. 7 is an exploded plan view of the line portion of the multilayer board 102.

FIG. 6 is a sectional view of a line portion of a multilayer board 102 according to the second preferred embodiment. FIG. 7 is an exploded plan view of the line portion of the multilayer board 102.

The multilayer board 102 includes a layered body 10B including a plurality of insulating base material layers 11, 12, 13, 14, 15 and a protective layer 1 that are layered and conductors (described later in detail) provided in and on the insulating base material layers 11, 12, 13, 14, 15.

The multilayer board 102 is different from the multilayer board 101 according to the first preferred embodiment in that the multilayer board 102 includes first sub-ground conductors SG21, SG41, second sub-ground conductor SG42, and third sub-ground conductors SG23, SG43. The layered body 10B according to the present preferred embodiment is different from the layered body 10A according to the first preferred embodiment in the number of the insulating base material layers. Other configurations are the same or substantially the same as those of the multilayer board 101.

The differences from the multilayer board 101 according to the first preferred embodiment will be described below.

As shown in FIGS. 6 and 7, the layered body 10B includes the insulating base material layers 15, 14, 13, 12, 11 and the protective layer 1 layered in this order.

Configurations of the plurality of insulating base material layers 11, 12, 13, 14, 15 and the protective layer 1 are the same or substantially the same as those of the plurality of insulating base material layers 11, 12, 13, 14 and the protective layer 1 described in the first preferred embodiment.

On a surface of the insulating base material layer 11, the first ground conductor G1 including a plurality of first openings OP1 is provided. In the insulating base material layer 11, the plurality of interlayer connecting conductors V11, V12, V13 are provided. Configurations of the first ground conductor G1 and the plurality of interlayer connecting conductors V11, V12, V13 are the same or substantially the same as those described in the first preferred embodiment.

On a surface of the insulating base material layer 12, the first signal line SL1, the first sub-ground conductor SG21, the second sub-ground conductor SG22, and the third sub-ground conductor SG23 are provided. Configurations of the first signal line SL1 and the second sub-ground conductor SG22 are the same or substantially the same as those described in the first preferred embodiment. The first sub-ground conductor SG21 is a linear conductor disposed at the center or approximate center in a short-side direction (Y-axis direction) of the insulating base material layer 12 and extends in an X-axis direction. The third sub-ground conductor SG23 is a linear conductor disposed close to a second side of the insulating base material layer 12 (a lower side of the insulating base material layer 12 in FIG. 7) and extends in the X-axis direction.

In the insulating base material layer 12, the plurality of interlayer connecting conductors V21, V22, V23 are provided. Configurations of the plurality of interlayer connecting conductors V21, V22, V23 are the same or substantially the same as those described in the first preferred embodiment.

On a surface of the insulating base material layer 13, the third ground conductor G3 and the second sub-ground conductor SG32 are provided. The third ground conductor G3 is a linear conductor disposed close to a second side of the insulating base material layer 13 (a lower side of the insulating base material layer 13 in FIG. 7) and extends in the X-axis direction. The second sub-ground conductor SG32 is a linear conductor disposed close to a first side of the insulating base material layer 13 (an upper side of the insulating base material layer 13) and extends in the X-axis direction.

In the insulating base material layer 13, the plurality of interlayer connecting conductors V31, V32, V33 are provided. Configurations of the plurality of interlayer connecting conductors V31, V32, V33 are the same or substantially the same as those described in the first preferred embodiment.

On a surface of the insulating base material layer 14, the second signal line SL2, the first sub-ground conductor SG41, the second sub-ground conductor SG42, and the third sub-ground conductor SG43 are provided. The second signal line SL2 is a linear conductor which is disposed at a position displaced to a second side of the insulating base material layer 14 (a lower side of the insulating base material layer 14 in FIG. 7) from a center in a short-side direction (Y-axis direction) of the insulating base material layer 14 and which extends in the X-axis direction. The first sub-ground conductor SG41 is a linear conductor disposed at the center or approximate center in the short-side direction of the insulating base material layer 14 and extends in the X-axis direction. The second sub-ground conductor SG42 is a linear conductor disposed close to a first side of the insulating base material layer 14 (an upper side of the insulating base material layer 14) and extends in the X-axis direction. The third sub-ground conductor SG43 is a linear conductor disposed close to the second side of the insulating base material layer 14 and extends in the X-axis direction.

In the insulating base material layer 14, a plurality of interlayer connecting conductors V41, V42, V43 are provided. The plurality of interlayer connecting conductors V41 are disposed at central positions in the short-side direction (Y-axis direction) of the insulating base material layer 14 and arranged in the X-axis direction. The plurality of interlayer connecting conductors V42 are disposed at positions close to the first side of the insulating base material layer 14 (the upper side of the insulating base material layer 14 in FIG. 7) and arranged in the X-axis direction. The plurality of interlayer connecting conductors V43 are disposed at positions close to the second side of the insulating base material layer 14 (the lower side of the insulating base material layer 12) and arranged in the X-axis direction. The interlayer connecting conductors V41, V42, V43 are preferably via conductors, through holes, or other suitable conductors, for example.

On a surface of the insulating base material layer 15, the second ground conductor G2 is provided. The second ground conductor G2 is provided on an entire or substantially an entire surface of the insulating base material layer 15.

As shown in FIGS. 6 and 7, the first sub-ground conductors SG21, SG41, the second sub-ground conductors SG22, SG32, SG42 and the third sub-ground conductor SG23, SG43 continuously extend side by side along the first signal line SL1 and the second signal line SL2.

In the present preferred embodiment, as shown in FIGS. 6 and 7, the third ground conductor G3 is disposed on the layer positioned between the first signal line SL1 and the second signal line SL2. With this configuration, a distance between the second signal line SL2 and the third ground conductor G3 is even shorter than that in the multilayer board 101 according to the first preferred embodiment, and therefore, spread of a magnetic field generated around the second signal line SL2 is further reduced or prevented. As a result, it is possible to further improve the isolation between the first signal line SL1 and the second signal line SL2.

Third Preferred Embodiment

In a third preferred embodiment of the present invention, a multilayer board including a plurality of second signal lines is shown.

Figure 8:
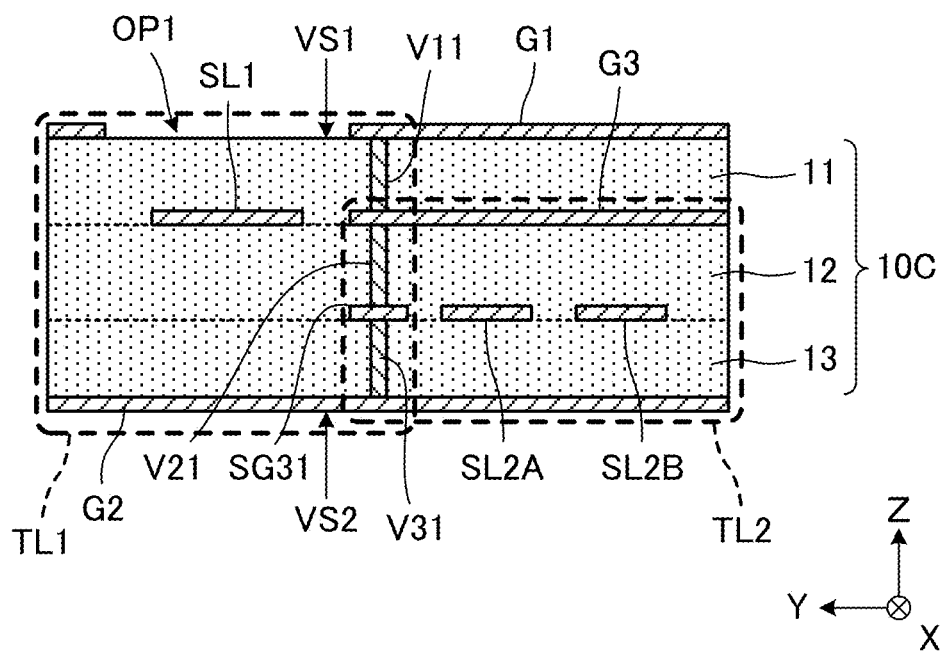
FIG. 8 is a sectional view of a line portion of a multilayer board 103 according to a third preferred embodiment of the present invention.
Figure 9:
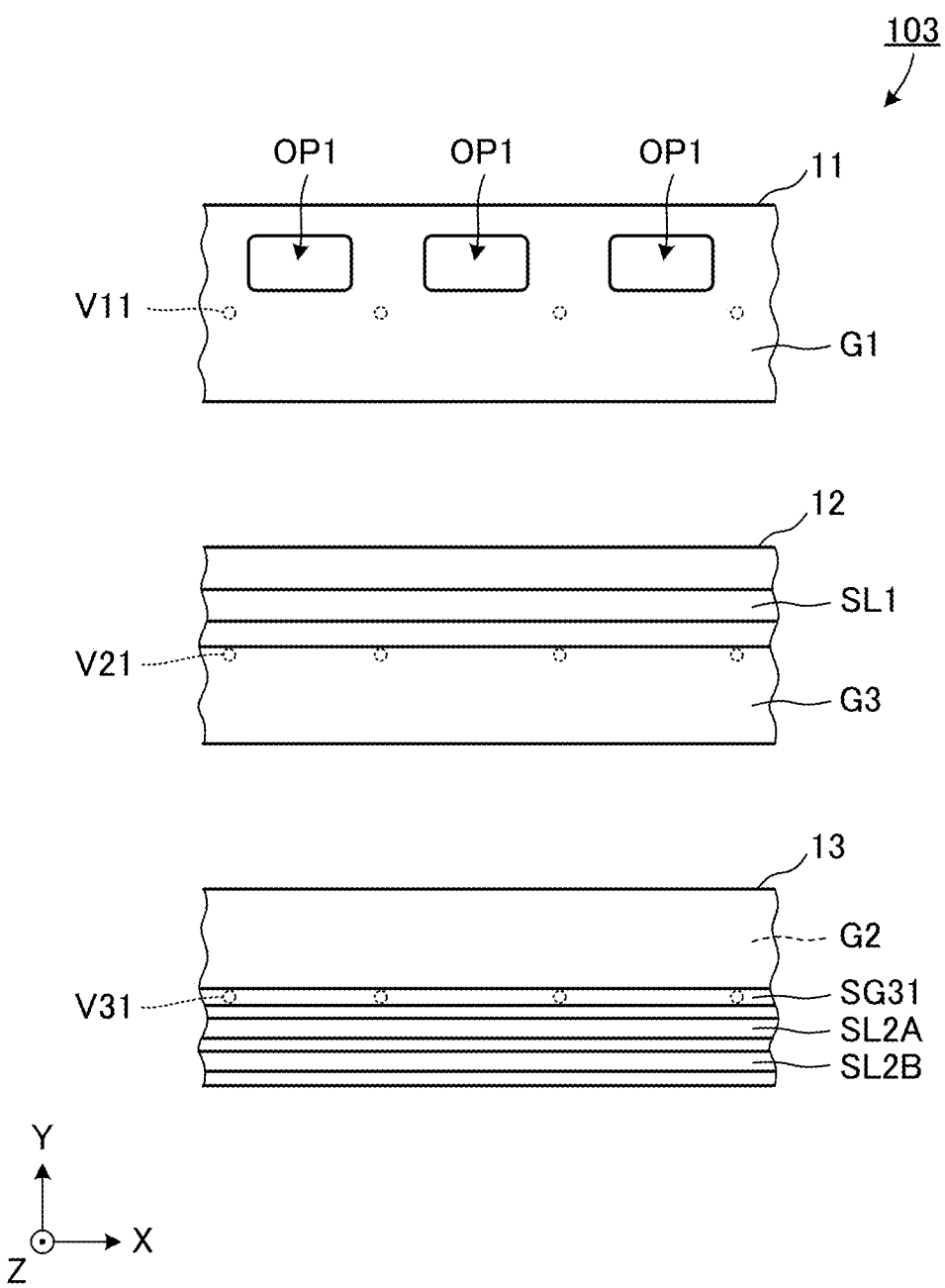
FIG. 9 is an exploded plan view of the line portion of the multilayer board 103.

FIG. 8 is a sectional view of a line portion of the multilayer board 103 according to the third preferred embodiment. FIG. 9 is an exploded plan view of the line portion of the multilayer board 103.

The multilayer board 103 includes a layered body 10C including a plurality of insulating base material layers 11, 12, 13 that are layered and conductors (described later in detail) provided in and on the insulating base material layers 11, 12, 13.

The multilayer board 103 is different from the multilayer board 101 according to the first preferred embodiment in that the multilayer board 103 includes two second signal lines SL2A, SL2B. The multilayer board 103 is different from the multilayer board 101 in that the multilayer board 103 does not include the second sub-ground conductors SG22, SG32, the third sub-ground conductor SG33, and the interlayer connecting conductors V12, V13, V22, V23, V32, V33. Other configurations are the same or substantially the same as those of the multilayer board 101.

The differences from the multilayer board 101 according to the first preferred embodiment will be described below.

As shown in FIGS. 8 and 9, the layered body 10C includes the insulating base material layers 11, 12, 13 layered in this order.

Configurations of the plurality of insulating base material layers 11, 12, 13 are the same or substantially the same as those of the plurality of insulating base material layers 11, 12, 13 described in the first preferred embodiment.

On a surface of the insulating base material layer 11, the first ground conductor G1 including a plurality of first openings OP1 is provided. In the insulating base material layer 11, the plurality of interlayer connecting conductors V11 are provided. Configurations of the first ground conductor G1 and the interlayer connecting conductors V11 are the same or substantially the same as those described in the first preferred embodiment.

On a surface of the insulating base material layer 12, the first signal line SL1 and the third ground conductor G3 are provided. In the insulating base material layer 12, the plurality of interlayer connecting conductors V21 are provided. Configurations of the first signal line SL1, the third ground conductor G3, and the interlayer connecting conductors V21 are the same or substantially the same as those described in the first preferred embodiment.

On a surface of the insulating base material layer 13, the two second signal lines SL2A, SL2B and the first sub-ground conductor SG31 are provided. In the insulating base material layer 13, the plurality of interlayer connecting conductors V31 are provided. Configurations of the first sub-ground conductor SG31 and the interlayer connecting conductors V31 are the same or substantially the same as those described in the first preferred embodiment. The two second signal lines SL2A, SL2B are linear conductors which are disposed at positions displaced to a second side of the insulating base material layer 13 (a lower side of the insulating base material layer 13 in FIG. 9) from a center in a short-side direction (Y-axis direction) of the insulating base material layer 13 and which extend in an X-axis direction. The second signal line SL2A and the second signal line SL2B include portions extending side by side with each other when seen in a Z-axis direction. The first sub-ground conductor SG31 and the two second signal lines SL2A, SL2B are arranged in this order along the short-side direction of the insulating base material layer 13.

On a back surface of the insulating base material layer 13, the second ground conductor G2 is provided. The second ground conductor G2 is provided on an entire or substantially an entire surface of the insulating base material layer 13.

In the present preferred embodiment, a first transmission line TL1 transmits analog signals and a second transmission line TL2 transmits digital signals.

The second transmission line TL2 is preferably the line to transmit the digital signals for the following reason. The second signal lines SL2A, SL2B of the second transmission line TL2 are disposed at positions closer the ground conductor (the first ground conductor G1, the second ground conductor G2, or the third ground conductor G3) than the first signal line SL1 of the first transmission line TL1. In other words, if the second transmission line TL2 transmits the analog signals, it is necessary to narrow line widths of the second signal lines SL2A, SL2B to adjust a characteristic impedance to a general characteristic impedance (e.g., about 50Ω). In this case, conductor losses of the second signal lines SL2A, SL2B increase.

Although the multilayer board including the two second signal lines SL2A, SL2B is shown in the present preferred embodiment, the number of second signal lines of the second transmission line TL2 is not restricted to two. The number of second signal lines of the second transmission line TL2 may be changed, if necessary, in such a range that advantageous functions and effects of preferred embodiments of the present invention are obtained.

Fourth Preferred Embodiment

In a fourth preferred embodiment of the present invention, an example of a multilayer board in which three transmission lines are provided will be shown.

Figure 10:
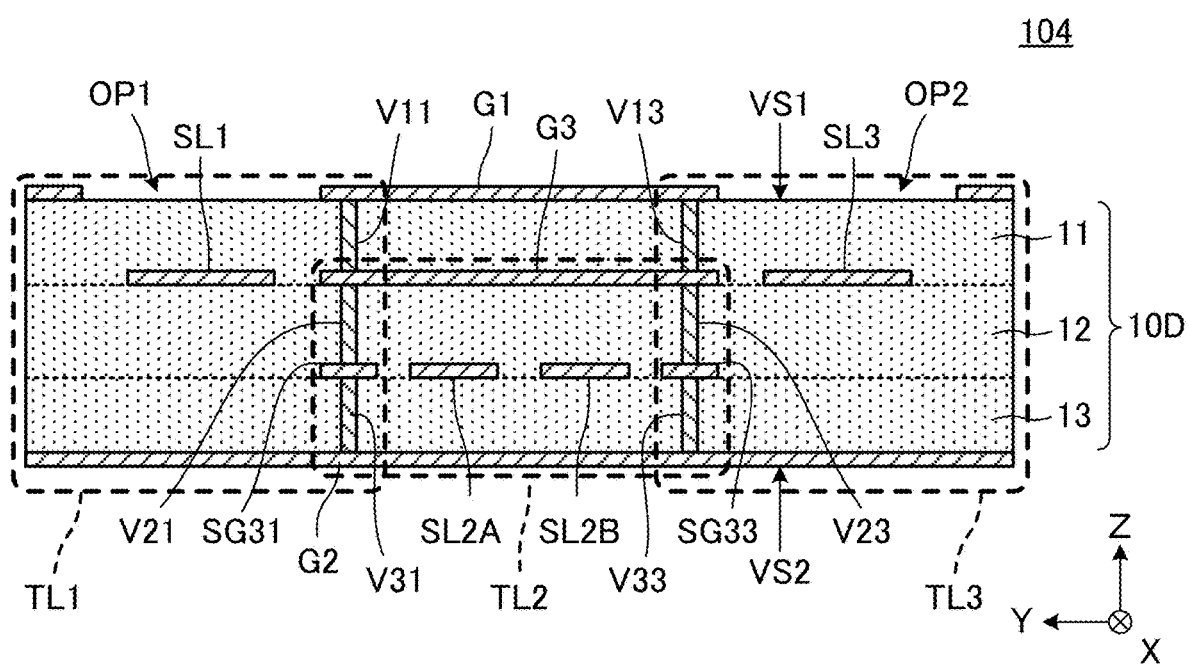
FIG. 10 is a sectional view of a line portion of a multilayer board 104 according to a fourth preferred embodiment of the present invention.

FIG. 10 is a sectional view of a line portion of the multilayer board 104 according to the fourth preferred embodiment. FIG. 11 is an exploded plan view of the line portion of the multilayer board 104.

The multilayer board 104 includes a layered body 10D including a plurality of insulating base material layers 11, 12, 13 that are layered and conductors (described later in detail) provided in and on the insulating base material layers 11, 12, 13.

The multilayer board 104 is different from the multilayer board 103 according to the third preferred embodiment in that the multilayer board 104 includes the third signal line SL3, the third sub-ground conductor SG33, and the interlayer connecting conductors V13, V23, V33. The multilayer board 104 is different from the multilayer board 103 in that the first ground conductor G1 includes second openings OP2. Other configurations are the same or substantially the same as those of the multilayer board 103.

The differences from the multilayer board 103 according to the third preferred embodiment will be described below.

As shown in FIGS. 10 and 11, the layered body 10D includes the insulating base material layers 13, 12, 11 that are layered in this order.

Configurations of the plurality of insulating base material layers 11, 12, 13 are the same or substantially the same as those of the plurality of insulating base material layers 11, 12, 13 described in the third preferred embodiment.

On a surface of the insulating base material layer 11, the first ground conductor G1 is provided. The first ground conductor is provided on an entire or substantially an entire surface of the insulating base material layer 11. The first ground conductor G1 includes a plurality of first openings OP1 and the plurality of second openings OP2. Configurations of the plurality of first openings OP1 are the same or substantially the same as those described in the first and third preferred embodiments. The plurality of second openings OP2 are preferably, for example, rectangular or substantially rectangular openings which are disposed at positions close to a second side of the insulating base material layer 11 (a lower side of the insulating base material layer 11 in FIG. 11) and which are arranged in an X-axis direction.

In the insulating base material layer 11, the plurality of interlayer connecting conductors V11, V13 are provided. The plurality of interlayer connecting conductors V11 are disposed at positions displaced to a first side of the insulating base material layer 11 (an upper side of the insulating base material layer 11 in FIG. 11) from a center in a short-side direction (Y-axis direction) of the insulating base material layer 11 and are arranged in the X-axis direction. The plurality of interlayer connecting conductors V13 are disposed at positions displaced to the second side of the insulating base material layer 11 (the lower side of the insulating base material layer 11 in FIG. 11) from the center in the short-side direction of the insulating base material layer 11 and are arranged in the X-axis direction.

On a surface of the insulating base material layer 12, the first signal line SL1, the third signal line SL3, and the third ground conductor G3 are provided. A configuration of the first signal line SL1 is the same or substantially the same as those described in the first and third preferred embodiments. The third signal line SL3 is a linear conductor which is disposed at a position displaced to a second side of the insulating base material layer 12 (a lower side of the insulating base material layer 12 in FIG. 11) from a center in a short-side direction (Y-axis direction) of the insulating base material layer 12 and which extends in the X-axis direction. The third ground conductor G3 is a linear conductor disposed at a position close to the center in the short-side direction of the insulating base material layer 12 and extends in the X-axis direction. The first signal line SL1, the third ground conductor G3, and the third signal line SL3 are arranged in this order along the short-side direction of the insulating base material layer 12.

In the insulating base material layer 12, the plurality of interlayer connecting conductors V21, V23 are provided. The plurality of interlayer connecting conductors V21 are disposed at positions displaced to a first side of the insulating base material layer 12 (an upper side of the insulating base material layer 12 in FIG. 11) from the center in the short-side direction (Y-axis direction) of the insulating base material layer 12 and are arranged in the X-axis direction. The plurality of interlayer connecting conductors V23 are disposed at positions displaced to the second side of the insulating base material layer 12 (the lower side of the insulating base material layer 12 in FIG. 11) from the center in the short-side direction of the insulating base material layer 12 and are arranged in the X-axis direction.

On a surface of the insulating base material layer 13, the two second signal lines SL2A, SL2B, the first sub-ground conductor SG31, and the third sub-ground conductor SG33 are provided. The two second signal lines SL2A, SL2B are linear conductors disposed at positions close to a center in a short-side direction (Y-axis direction) of the insulating base material layer and extend in the X-axis direction. The first sub-ground conductor SG31 is a linear conductor which is disposed at a position displaced to a first side of the insulating base material layer 13 (an upper side of the insulating base material layer 13 in FIG. 11) from the center in the short-side direction of the insulating base material layer 13 and which extends in the X-axis direction. The third sub-ground conductor SG33 is a linear conductor which is disposed at a position displaced to a second side of the insulating base material layer 13 (a lower side of the insulating base material layer 13 in FIG. 11) from the center in the short-side direction of the insulating base material layer 13 and which extends in the X-axis direction. The first sub-ground conductor SG31, the two second signal lines SL2A, SL2B, and the third sub-ground conductor SG33 are arranged in this order along the short-side direction of the insulating base material layer 13. On a back surface of the insulating base material layer 13, the second ground conductor G2 is provided. The second ground conductor G2 is provided on an entire or substantially an entire surface of the insulating base material layer 13.

In the insulating base material layer 13, the plurality of interlayer connecting conductors V31, V33 are provided. The plurality of interlayer connecting conductors V31 are disposed at positions displaced to the first side of the insulating base material layer 13 (an upper side of the insulating base material layer 13 in FIG. 11) from the center in the short-side direction (Y-axis direction) of the insulating base material layer 13 and are arranged in the X-axis direction. The plurality of interlayer connecting conductors V33 are disposed at positions displaced to the second side of the insulating base material layer 13 (the lower side of the insulating base material layer 13 in FIG. 11) from the center in the short-side direction of the insulating base material layer 13 and are arranged in the X-axis direction.

As shown in FIGS. 10 and 11, the third signal line SL3 overlaps the second openings OP2 when seen in the Z-axis direction. As shown in FIG. 10, the third signal line SL3 is disposed at the position on an opposite side of the second signal lines SL2A, SL2B from the first signal line SL1 (to be farther from the second signal lines SL2A, SL2B in a −Y direction).

The second signal lines SL2A, SL2B are disposed on a layer different from a layer including the first signal line SL1 and the third signal line SL3 and include portions extending side by side with the first signal line SL1 and the third signal line SL3 when seen in the Z-axis direction. Furthermore, the first signal line SL1 and the third signal line SL3 have greater line widths (widths in the Y-axis direction) than the second signal lines SL2A, SL2B.

In the present preferred embodiment, as shown in FIG. 9, for example, the plurality of second openings OP2 are arranged along an extending direction (X-axis direction) of the third signal line SL3 when seen in the Z-axis direction. In the present preferred embodiment, the third ground conductor G3 is disposed on a layer including the first signal line SL1 and the third signal line SL3.

As shown in FIG. 10, a third transmission line TL3 includes the third signal line SL3, the first ground conductor G1, the second ground conductor G2, the insulating base material layer sandwiched between the first signal line SL1 and the first ground conductor G1, and the insulating base material layers 12, 13 sandwiched between the first signal line SL1 and the second ground conductor G2. In "the third transmission line", only the insulating base material layer (11) is disposed and no other conductor exists between the third signal line SL3 and the first ground conductor G1 facing each other in the Z-axis direction. In "the third transmission line", only the insulating base material layers (12, 13) are disposed and no other conductor exists between the third signal line SL3 and the second ground conductor G2 facing each other in the Z-axis direction.

The first transmission line TL1, the second transmission line TL2, and the third transmission line TL3 are disposed in this order along a short-side direction (Y-axis direction) of the layered body 10D. In the present preferred embodiment, the first transmission line TL1 and the third transmission line TL3 transmit analog signals and the second transmission line TL2 transmits digital signals.

The multilayer board 104 according to the present preferred embodiment obtains the following advantageous effects in addition to the advantageous effects described in the third preferred embodiment.

Because the third signal line SL3 overlaps the second openings OP2 in the first ground conductor G1 in the multilayer board 104, a capacitance between the third signal line SL3 and the first ground conductor G1 is reduced and it is possible to dispose the third signal line SL3 closer to the first ground conductor G1. More specifically, the third signal line SL3 is sandwiched between the first ground conductor G1 and the second ground conductor G2 and displaced toward the first ground conductor G1 in the Z-axis direction. In other words, in the multilayer board 104, the third signal line SL3 and the second signal lines SL2A, SL2B are disposed at different positions in the Z-axis direction. With this configuration, as compared with the case in which the third signal line SL3 and the second signal lines SL2A, SL2B are disposed on the same layer, it is possible to increase distances between the third signal line SL3 and the second signal lines SL2A, SL2B to improve isolation between the third signal line SL3 and the second signal lines SL2A, SL2B.

In the present preferred embodiment, the third signal line SL3 is disposed at the position on the opposite side of the second signal lines SL2A, SL2B from the first signal line SL1 (to be farther from the second signal lines SL2A, SL2B in the −Y direction). In other words, in a configuration of the multilayer board 104, the second transmission line TL2 is sandwiched between the first transmission line TL1 and the third transmission line TL3. With this configuration, it is possible to improve isolation between the first signal line SL1 and the third signal line SL3.

Because the third ground conductor G3 is disposed on a layer including the third signal line SL3 in the multilayer board 104, distances between the second signal lines SL2A, SL2B and the third ground conductor G3 are shorter than the distances between the third signal line SL3 and the second signal lines SL2A, SL2B. Therefore, magnetic fields generated around the second signal lines SL2A, SL2B are effectively intercepted by the third ground conductor G3, which further improves the isolation between the third signal line SL3 and the second signal lines SL2A, SL2B.

Although the third ground conductor G3 is disposed on a layer including the third signal line SL3 in the example shown in the present preferred embodiment, the present invention is not restricted to this configuration. The third ground conductor G3 may be disposed on a layer positioned between the third signal line SL3 and the second signal lines SL2A, SL2B. In this case, the distances between the second signal lines SL2A, SL2B and the third ground conductor G3 are even shorter and spread of the magnetic fields generated around the second signal lines SL2A, SL2B is further reduced or prevented, which further increases the isolation between the second signal lines SL2A, SL2B and the third signal line SL3.

Although the first signal line SL1, the third signal line SL3, and the third ground conductor G3 are disposed on the same layer in the example shown in the present preferred embodiment, the third signal line SL3 is not necessarily disposed on a layer including the first signal line SL1 and the third ground conductor G3. However, if the third signal line SL3 is disposed on a layer including the first signal line SL1 and the third ground conductor G3, it is possible to reduce the number of insulating base material layers in and on which the conductors are provided. As a result, the number of steps for manufacturing the multilayer board 104 is reduced, which reduces manufacturing cost.

Although the layered body is a rectangular or substantially rectangular flat plate in the example shown in each of the above-described preferred embodiments, the present invention is not restricted to this configuration. A planar shape of the layered body is not restricted to the rectangular or substantially rectangular shape and may be changed if necessary in such a range that the advantageous functions and effects of the present invention are obtained. The planar shape of the layered body may be a circle, an oval, a polygon, an L shape, a crank, a T shape, a Y shape, or other suitable shape, for example.

Although the multilayer board including the layered body including the three, four, or five insulating base material layers that are laminated is shown in each of the above-described preferred embodiments, the present invention is not restricted to this configuration. The number of insulating base material layers of the layered body may be changed if necessary in such a range that the advantageous functions and effects of the present invention are obtained.

Although the multilayer board in which the two or three transmission lines are provided is shown in each of the above-described preferred embodiments, the present invention is not restricted to this configuration. The number of transmission lines provided in the multilayer board may be changed if necessary in such a range that the advantageous functions and effects of the present invention are obtained and four or more transmission lines may be provided in the multilayer board. Although the multilayer board including the two connection portions (the first connection portion CP1 and the second connection portion CP2) is shown in each of the above-described preferred embodiments, the number of connection portions may be changed if necessary in such a range that the advantageous functions and effects of the present invention are obtained and the multilayer board may include three or more connection portions.

Although the multilayer board in which the connectors are mounted on only the first main surface VS1 of the layered body is shown in each of the above-described preferred embodiments, the multilayer board in the present invention is not restricted to this configuration. The connectors may be mounted on both of the first main surface VS1 and the second main surface VS2 of the layered body. The connectors are not absolutely necessary for the multilayer board in the present invention. The electrodes exposed on the surface of the layered body may be connected to electrodes provided on the circuit boards by conductive bonding material, such as solder, for example.

Although the first ground conductor G1 includes the plurality of first openings OP1 in the example shown each of the above-described preferred embodiments, the present invention is not restricted to this configuration. The first ground conductor G1 may include a single first opening OP1. However, if the first opening having a large area is provided in the first ground conductor G1, a ground potential of the first ground conductor G1 may become unstable. Therefore, it is preferable to provide the plurality of first openings having small areas in the first ground conductor G1. This is also true for the second openings OP2.

Although the connection portions (the first connection portion CP1 and the second connection portion CP2) are provided close to end portions in the longitudinal direction of the layered body in the example shown in each of the above-described preferred embodiments, the present invention is not restricted to this configuration. The positions of the connection portions may be changed if necessary in such a range that the advantageous functions and effects of the present invention are obtained and the connection portions may be provided close to a center in the longitudinal direction of the layered body, for example.

Although the multilayer board on which the first connection portion CP1, the line portion SP, and the second connection portion CP2 are arranged in this order in the X-axis direction is shown in each of the above-described preferred embodiments, the present invention is not restricted to this configuration. The arrangement of the connection portions (the first connection portion CP1, the second connection portion CP2, and other connection portions) and the line portion SP may be changed if necessary in such a range that the advantageous functions and effects of the present invention are obtained. Although the line portion SP and the signal lines (the first signal line SL1, the second signal line(s) SL2, and the third signal line SL3) extend in the X-axis direction in the example shown in each of the above-described preferred embodiments, the present invention is not restricted to this configuration. Shapes of the line portion SP and the signal lines are not restricted to linear shapes extending in the X-axis direction and may be bent in the Y-axis direction, for example, and bent in L shapes or crank shapes when seen in the Z-axis direction, for example.

Although the connection portions (the first connection portion CP1 and the second connection portion CP2) branch in Y shapes from the line portion SP in the example shown in each of the above-described preferred embodiments, the present invention is not restricted to the configuration in which the connection portions are branched.

Although the sub-ground conductors (the first sub-ground conductor(s), the second sub-ground conductors, and the third sub-ground conductor(s)) continuously extend side by side along the signal line(s) (the first signal line, the second signal line(s), or the third signal line) in the example shown in each of the above-described preferred embodiments, the present invention is not restricted to this configuration. The sub-ground conductors may extend intermittently and side by side along the signal line(s). In this case, the sub-ground conductors are preferably connected to other ground conductors by interlayer connecting conductors, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
   a layered body including a plurality of insulating base material layers that are layered; and
   a first signal line, a second signal line, a first ground conductor, a second ground conductor, and a third ground conductor provided in and on the plurality of insulating base material layers; wherein
   a first transmission line includes the first signal line, the first ground conductor, the second ground conductor, an insulating base material layer sandwiched between the first signal line and the first ground conductor of the plurality of insulating base material layers, and an insulating base material layer sandwiched between the first signal line and the second ground conductor of the plurality of insulating base material layers;
   a second transmission line includes the second signal line, the second ground conductor, the third ground conductor, an insulating base material layer sandwiched between the second signal line and the second ground conductor of the plurality of insulating base material layers, and an insulating base material layer sandwiched between the second signal line and the third ground conductor of the plurality of insulating base material layers;
   the second signal line is provided on a layer different from a layer of the plurality of insulating base material layers including the first signal line;
   the second signal line includes a portion extending side by side with the first signal line when seen in the layering direction;
   the first ground conductor, the second ground conductor, and the third ground conductor are connected by an interlayer connecting conductor; and
   the third ground conductor is disposed on a layer of the plurality of insulating base material layers including a layer of the plurality of insulating base material layers positioned between the first signal line and the second signal line of the plurality of insulating base material layers.

2. The multilayer board according to claim 1, wherein the interlayer connecting conductor is disposed between the first signal line and the second signal line when seen in the layering direction.

3. The multilayer board according to claim 1, wherein the interlayer connecting conductor is disposed at a position on an opposite side of the first signal line from the second signal line when seen in the layering direction.

4. The multilayer board according to claim 1, wherein the interlayer connecting conductor is disposed at a position on an opposite side of the second signal line from the first signal line when seen in the layering direction.

5. The multilayer board according to claim 1, wherein the first ground conductor includes a plurality of openings that are arranged along an extending direction of the first signal line when seen in the layering direction.

6. An electronic device comprising:
a first circuit;
a second circuit; and
the multilayer board according to claim 1; wherein
the first circuit and the second circuit are connected by the multilayer board.

7. The multilayer board according to claim 1, wherein
the first transmission line is configured to transmit an analog signal; and
the second transmission line is configured to transmit a digital signal.

8. The multilayer board according to claim 1, further comprising:
a third signal line provided on one of the plurality of insulating base material layers; and
an opening provided in the first ground conductor; wherein
the third signal line overlaps the opening when seen in the layering direction and is disposed at a position on an opposite side of the second signal line from the first signal line;
a third transmission line includes the third signal line, the first ground conductor, the second ground conductor, an insulating base material layer sandwiched between the third signal line and the first ground conductor of the plurality of insulating base material layers, and an insulating base material layer sandwiched between the third signal line and the second ground conductor of the plurality of insulating base material layers;
the second signal line is disposed on a layer of the plurality of insulating base material layers different from a layer including the third signal line and includes a portion extending side by side with the third signal line when seen in the layering direction; and
the third ground conductor is disposed on a layer of the plurality of insulating base material layers including the third signal line or a layer of the plurality of insulating base material layers positioned between the third signal line and the second signal line.

9. The multilayer board according to claim 8, wherein the opening includes a plurality of openings that are arranged along an extending direction of the third signal line when seen in the layering direction.

10. A multilayer board comprising:
a layered body including a plurality of insulating base material layers that are layered;
a first signal line, a second signal line, a first ground conductor, a second ground conductor, and a third ground conductor provided in and on the plurality of insulating base material layers; and
a sub-ground conductor provided on the plurality of insulating base material layers; wherein
a first transmission line includes the first signal line, the first ground conductor, the second ground conductor, an insulating base material layer sandwiched between the first signal line and the first ground conductor of the plurality of insulating base material layers, and an insulating base material layer sandwiched between the first signal line and the second ground conductor of the plurality of insulating base material layers;
a second transmission line includes the second signal line, the third ground conductor, and an insulating base material layer sandwiched between the second signal line and the third ground conductor of the plurality of insulating base material layers;
the second signal line is provided on a layer different from a layer of the plurality of insulating base material layers including the first signal line;
the second signal line includes a portion extending side by side with the first signal line when seen in the layering direction;
the first ground conductor, the second ground conductor, and the third ground conductor are connected by an interlayer connecting conductor;
the third ground conductor is disposed on a layer of the plurality of insulating base material layers including the first signal line or a layer of the plurality of insulating base material layers positioned between the first signal line and the second signal line of the plurality of insulating base material layers; and
the sub-ground conductor is disposed at a position on an opposite side of the first signal line from the second signal line when seen in the layering direction and disposed between the first ground conductor and the third ground conductor in the layering direction.

11. An electronic device comprising:
a first circuit;
a second circuit; and
the multilayer board according to claim 10; wherein
the first circuit and the second circuit are connected by the multilayer board.

12. The multilayer board according to claim 10, wherein
the first transmission line is configured to transmit an analog signal; and
the second transmission line is configured to transmit a digital signal.

13. A multilayer board comprising:
a layered body including a plurality of insulating base material layers that are layered;
a first signal line, a second signal line, a first ground conductor, a second ground conductor, and a third ground conductor provided in and on the plurality of insulating base material layers; and
a sub-ground conductor provided on the plurality of insulating base material layers; wherein
a first transmission line includes the first signal line, the first ground conductor, the second ground conductor, an insulating base material layer sandwiched between the first signal line and the first ground conductor of the plurality of insulating base material layers, and an insulating base material layer sandwiched between the first signal line and the second ground conductor of the plurality of insulating base material layers;
a second transmission line includes the second signal line, the third ground conductor, and an insulating base material layer sandwiched between the second signal line and the third ground conductor of the plurality of insulating base material layers;
the second signal line is provided on a layer different from a layer of the plurality of insulating base material layers including the first signal line;

the second signal line includes a portion extending side by side with the first signal line when seen in the layering direction;

the first ground conductor, the second ground conductor, and the third ground conductor are connected by an interlayer connecting conductor;

the third ground conductor is disposed on a layer of the plurality of insulating base material layers including the first signal line or a layer of the plurality of insulating base material layers positioned between the first signal line and the second signal line of the plurality of insulating base material layers; and the sub-ground conductor is disposed at a position on an opposite side of the second signal line from the first signal line when seen in the layering direction and disposed between the second ground conductor and the third ground conductor in the layering direction.

14. An electronic device comprising:
a first circuit;
a second circuit; and
the multilayer board according to claim 13; wherein
the first circuit and the second circuit are connected by the multilayer board.

15. The multilayer board according to claim 13, wherein
the first transmission line is configured to transmit an analog signal; and
the second transmission line is configured to transmit a digital signal.

* * * * *